(12) United States Patent
Mukherjee et al.

(10) Patent No.: US 9,601,995 B1
(45) Date of Patent: Mar. 21, 2017

(54) LOW POWER RADIO FREQUENCY ENVELOPE DETECTOR

(71) Applicant: Texas Instruments Incorporated, Dallas, TX (US)

(72) Inventors: Subhashish Mukherjee, Bangalore (IN); Kumar Anurag Shrivastava, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/145,775

(22) Filed: May 3, 2016

(51) Int. Cl.
    *G01R 19/00* (2006.01)
    *H02M 3/07* (2006.01)
    *H03K 3/0233* (2006.01)
    *H03K 17/22* (2006.01)

(52) U.S. Cl.
    CPC .......... *H02M 3/07* (2013.01); *H03K 3/02337* (2013.01); *H03K 17/223* (2013.01)

(58) Field of Classification Search
    CPC .................. G01R 19/04; H02M 3/07
    See application file for complete search history.

(56) References Cited

U.S. PATENT DOCUMENTS 6,373,236 B1 * 4/2002 Lemay, Jr. ............. G01R 21/10
323/369

* cited by examiner

*Primary Examiner* — Daniel Puentes
(74) *Attorney, Agent, or Firm* — John R. Pessetto; Charles A. Brill; Frank D. Cimino

(57) ABSTRACT

A low power radio frequency envelope detector includes a charging transistor for controlling the charge supplied to an output capacitor. A first input capacitor couples an input signal to a gate of the charging transistor. A second input capacitor couples a first polarity of the input signal to a first diode such that the first diode is operable to couple charge to the first input capacitor and to the gate of the charging transistor in response to a positive excursion of the first polarity of the input signal. A third input capacitor couples a second polarity of the input signal to a second diode coupled in series with the first diode. The first and second diodes are operable to couple charge to the first input capacitor and to the gate of the charging transistor in response to a positive excursion of the first polarity of the input signal.

20 Claims, 7 Drawing Sheets

LOW POWER RADIO FREQUENCY ENVELOPE DETECTOR

BACKGROUND

Many applications of electronic circuits include integrated circuits that operate using power supplies having a ground voltage that is different from the ground voltages of other integrated circuits. When the ground voltages differ, various kinds of communication couplers are used to permit coupling of information while maintaining direct current (DC) electrical isolation. The communication couplers include various kinds of couplers such as opto-couplers and digital isolators (where capacitive and inductive digital isolators are becoming more frequently chosen rather than opto-isolators). The communication between the two isolated sides coupled through a digital isolator is often accomplished using carrier-based modulation scheme such as "on-off keying" (OOK). In such systems, radio frequency (RF) detectors typically have high static current consumption, which often results in high system power dissipation. However, such circuits are often unsuitable for many battery-powered, high-speed applications due to increasingly greater data rates and the accompanying increase of currents used to power the high-speed communication couplers.

SUMMARY

The problems noted above can be addressed in a low power radio frequency (RF) power detector that includes a charging transistor for controlling the charge supplied to an output capacitor. A first input capacitor couples an input signal to a gate of the charging transistor. A second input capacitor couples a first polarity of the input signal to a first diode such that the first diode is operable to couple charge to the first input capacitor and to the gate of the charging transistor in response to a positive excursion of the first polarity of the input signal. A third input capacitor couples the second polarity of the input signal to a second diode coupled in series with the first diode. The first and second diodes are operable to couple charge to the first input capacitor and to the gate of the charging transistor in response to a positive excursion of the first polarity of the input signal.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . " Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion. The term "input" can mean either a source or a drain (or even a control input such as a gate where context indicates) of a PMOS (positive-type metal oxide semiconductor) or NMOS (negative-type metal oxide semiconductor) transistor. The term "mode" can mean a particular architecture, configuration (including electronically configured configurations), arrangement, application, and the like, for accomplishing a purpose. The term "processor" can mean a circuit for processing, a state machine and the like for execution of programmed instructions for transforming the processor into a special-purpose machine, circuit resources used for the processing, and combinations thereof. The term "radio frequency" can mean any frequency that can be transmitted and received electromagnetically across a wireless medium.

Figure 1:
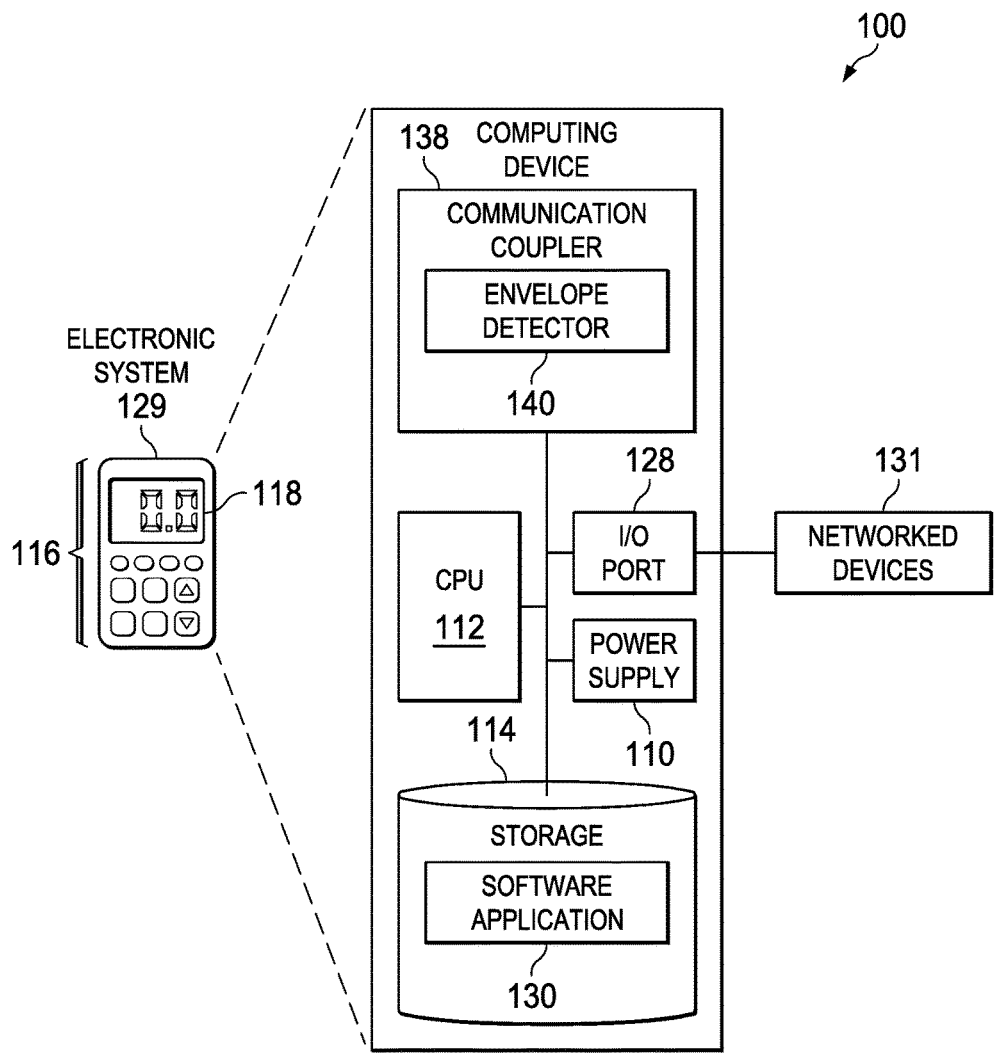
FIG. 1 shows an illustrative computing system 100 in accordance with certain embodiments of the disclosure.

FIG. 1 shows an illustrative computing system 100 in accordance with certain embodiments of the disclosure. For example, the computing system 100 is, or is incorporated into, an electronic system 129, such as a computer, electronics control "box" or display, communications equipment (including transmitters), or any other type of electronic system arranged to generate electrical signals.

In some embodiments, the computing system 100 comprises a megacell or a system-on-chip (SoC) which includes control logic such as a CPU 112 (Central Processing Unit), a storage 114 (e.g., random access memory (RAM)) and a power supply 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores instructions for one or more software applications 130 (e.g., embedded applications) that, when executed by the CPU 112, perform any suitable function associated with the computing system 100.

The CPU 112 comprises memory and logic circuits that store information frequently accessed from the storage 114. The computing system 100 is often controlled by a user using a UI (user interface) 116, which provides output to and receives input from the user during the execution the software application 130. The output is provided using the display 118, indicator lights, a speaker, vibrations, and the like. The input is received using audio and/or video inputs (using, for example, voice or image recognition), and electrical and/or mechanical devices such as keypads, switches, proximity detectors (including sensors), gyros, accelerometers, and the like. The CPU 112 is coupled to I/O (Input-Output) port 128, which provides an interface operable to receive input from (and/or provide output to) networked devices 131. The networked devices 131 can include any device capable of point-to-point and/or networked communications with the computing system 100. The computing system 100 can also be coupled to peripherals and/or computing devices, including tangible, non-transitory media (such as flash memory) and/or cabled or wireless media. These and other input and output devices are selectively coupled to the computing system 100 by external devices using wireless or cabled connections. The storage 114 can be accessed by, for example, by the networked devices 131.

The CPU 112 is coupled to I/O (Input-Output) port 128, which provides an interface operable to receive input from (and/or provide output to) peripherals and/or computing devices 131, including tangible (e.g., "non-transitory") media (such as flash memory) and/or cabled or wireless media (such as a Joint Test Action Group (JTAG) interface). These and other input and output devices are selectively coupled to the computing system 100 by external devices using or cabled connections. The CPU 112, storage 114, and power supply 110 can be coupled to an external power supply (not shown) or coupled to a local power source (such as a battery, solar cell, alternator, inductive field, fuel cell, charged capacitor, and the like).

The computing system 100 includes a communication coupler 138 for blocking direct current of a received (e.g., information) signal. As discussed below, the communication coupler 138 typically includes an envelope detector 80 for converting burst transmissions having a high frequency carrier signal into digital quantities. In an embodiment, the communication coupler 138 couples (e.g., capacitively or inductively) the burst transmissions from a primary to a secondary, where a power (e.g., voltage) loss in received signal in the secondary is typically encountered due to inefficiencies of the coupling. The envelope detector 80 is for determining the envelope of received signal in the secondary such that information in provide output to) peripherals and/or computing devices 131, including tangible (e.g., "non-transitory") media (such as flash memory) and/or cabled or wireless media (such as a Joint Test Action Group (JTAG) interface). These and other input and output devices are selectively coupled to the computing system 100 by external devices using or cabled connections. The CPU 112, storage 114, and power supply 110 can be coupled to an external power supply (not shown) or coupled to a local power source (such as a battery, solar cell, alternator, inductive field, fuel cell, charged capacitor, and the like).

The computing system 100 includes a communication coupler 138 for blocking direct current of a received (e.g., information) signal. As discussed the received signal in the secondary can be extracted and detected.

However, the voltage of the received signal in the secondary in an embodiment is typically around 100 mV or less. The disclosed envelope detector 80 is arranged to detect the envelope of the relatively low amplitude RF input signals with very low quiescent current using standard CMOS integrated circuits. As discussed below with reference to FIG. 2, conventional communication couplers use active amplifiers to amplify the relatively low amplitude RF input signals.

Figure 2:
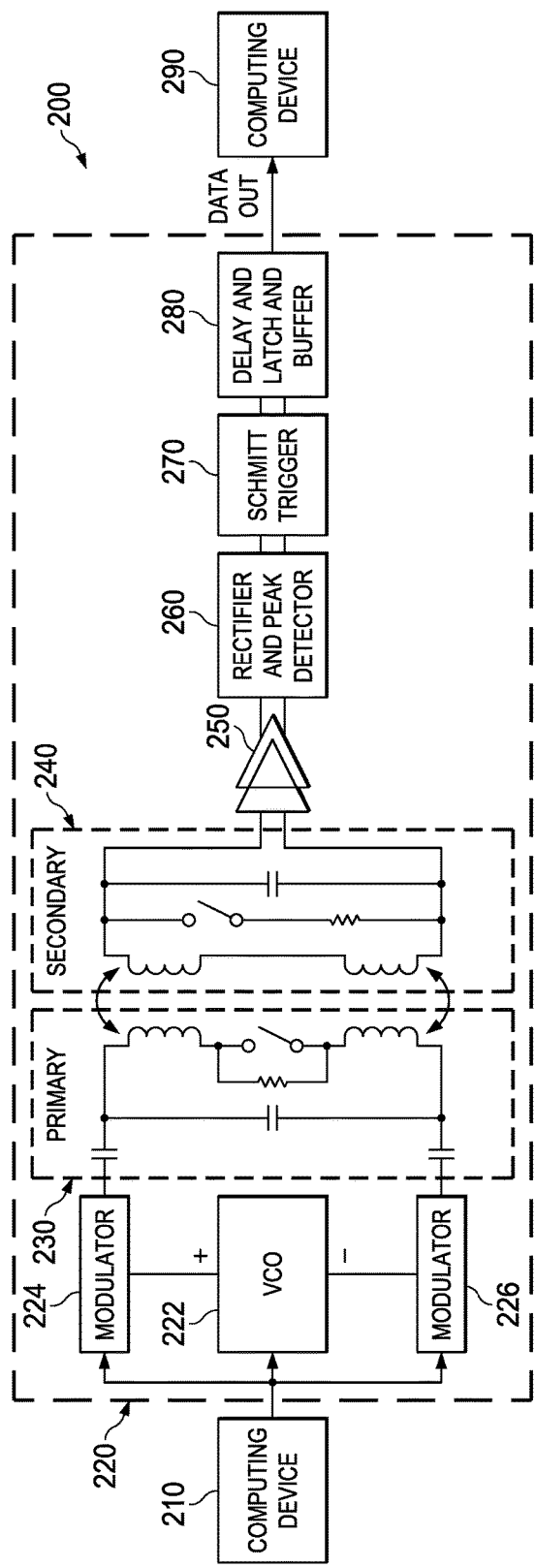
FIG. 2 is a block diagram of an example inductively coupled digital isolator system 200.

FIG. 2 is a block diagram of an example inductively coupled digital isolator system 200. The digital isolator system 200 includes a computing device 210, an inductively coupled digital isolator 220, and a computing device 290. In operation, the computing device 210 is arranged to transmit digital information to be received by the computing device 290.

The inductively coupled digital isolator 220 is arranged to receive the transmitted digital information. The transmitted the digital information is coupled to the voltage controlled oscillator (VCO) 222, the high side modulator 224, and the low side modulator 226. The voltage controlled oscillator 222 is arranged to generate a high frequency carrier signal to be modulated by the high-high-side modulator 224 and the low-side modulator 226. The high-side modulator 224 and the low-side modulator 226 are arranged in a push/pull configuration and are operable to generate burst transmissions, which are gated in accordance with the digital information received from the computing device 210.

The burst transmissions are coupled to the primary 230 of the inductively coupled digital isolator 220. The primary 230 is operable to generate an electromagnetic field for crossing an isolation boundary and inducing a voltage in the secondary 240. The power of the isolated signal and the secondary 240 is substantially attenuated below the power level of the signal used to generate the electromagnetic field. The amplifier 250 is arranged to amplify (which consumes relatively large amounts of power) for further processing.

The rectifier and peak detector 260 is operable to convert the alternating current (AC) amplified, isolated signal to a direct current (DC) isolated signal. The Schmitt trigger 270 is operable to convert the DC isolated signal from an analog value to a digital value. The delay latch buffer 280 is operable to "deglitch" (e.g., filter out erroneous transitions in) the digital signal where transitions in the signal exceed a bit rate expected for the digital information received from the computing device 210. The delay latch buffer 280 is operable to transmit the filtered digital isolated signal as signal "data out" such that the computing device 290 is coupled to the digital information transmitted by the computing device 210.

Figure 3:
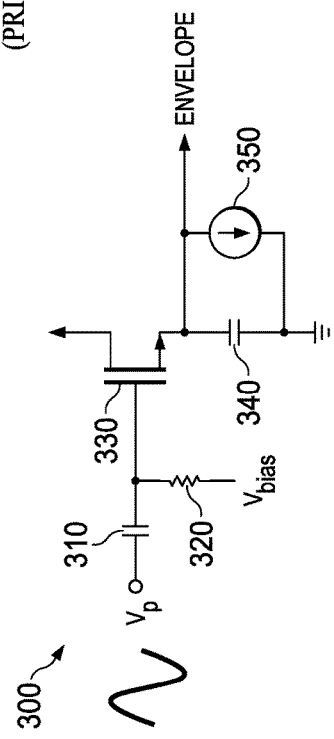
FIG. 3 is a schematic of an example envelope detector.

FIG. 3 is a schematic of an example envelope detector. The envelope detector 300 includes an input capacitor 310, a bias resistor 320, an NMOS transistor 330, an integrator capacitor 340, and a current source 350. In operation, the input capacitor 310 is operable to capacitively couple the input signal Vp (e.g., a non-inverted signal such as the isolated signal received in the secondary 240 described above) to the gate of transistor 330. A bias resistor 320 is operable to limit the voltage supplied by signal Vbias such that the (AC-coupled) isolated signal as voltage is suitable for controlling the gate of transistor 330. The transistor 330 is operable to generate a current that varies in response to the gate voltage of transistor 330.

The current generated at the source of transistor 330 is coupled to a first terminal of the integrator capacitor 340 (which has a second terminal coupled to ground). Accordingly, a voltage (e.g., the "envelope" signal) is developed at the source of transistor 330. Current source 350 is operable to slowly discharge the integrator capacitor 340 such that the envelope signal (illustrated below with respect to FIG. 4) is substantially similar to the digital signal used to take the high frequency carrier signal from which the signal Vp was received across a direct current isolation barrier.

Figure 4:
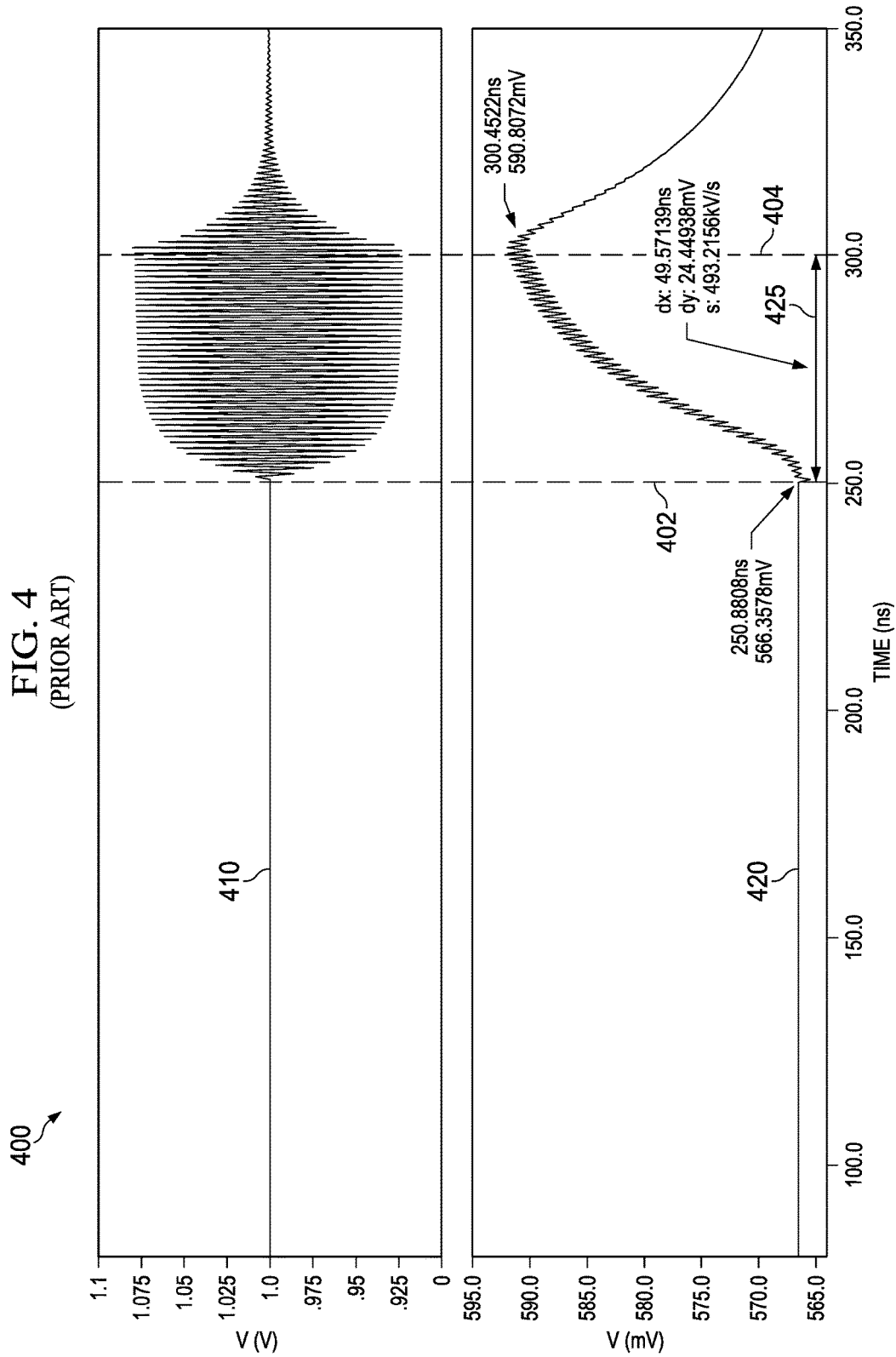
FIG. 4 is a waveform diagram illustrating operation of the envelope detector of FIG. 3.

FIG. 4 is a waveform diagram illustrating operation of the envelope detector of FIG. 3. The waveform diagram 400 includes waveform 410 and waveform 420. The waveform 410 is the signal Vp discussed above with reference to FIG. 3. The waveform of 410 is characterized by a high frequency burst that is initiated at time 402 and that is released (e.g., gated off) at time 404. In an example simulation, the waveform 410 has a value of 1V before time 402 and has a peak value generally around 1.075V.

The waveform 420 is the envelope signal discussed above with reference to FIG. 3. The waveform 420 starts to trend upward at time 402 in response to the initiation of the high frequency burst reaching a generally maximum value at time 404, at which time the high frequency burst is released. The voltage level of the waveform 420 starts to decay at time 404 in response to the end of the assertion of the burst (which has a duration 422 of 50 nanoseconds). In the example simulation, the waveform 420 has a value of around 566 mV until time 402, at which time the waveform 420 generally trends upwards and reaches a value generally (e.g., as measured near the midpoint of an oscillation that includes time 404) around 591 mV.

In the example simulation, the output (e.g., envelope signal) of the envelope detector 300 is further attenuated from the (e.g., already weakened) input signal. For example, the example simulation illustrates that for a 1 GHz, 75 mV peak input signal, the envelope detector 300 generates (e.g., a relatively weak) 30 mV output over a 50 ns period. Accordingly, many conventional solutions use (e.g., for a weak signal) relatively extensive post amplification, which consumes additional power even during quiescent periods.

Figure 5:
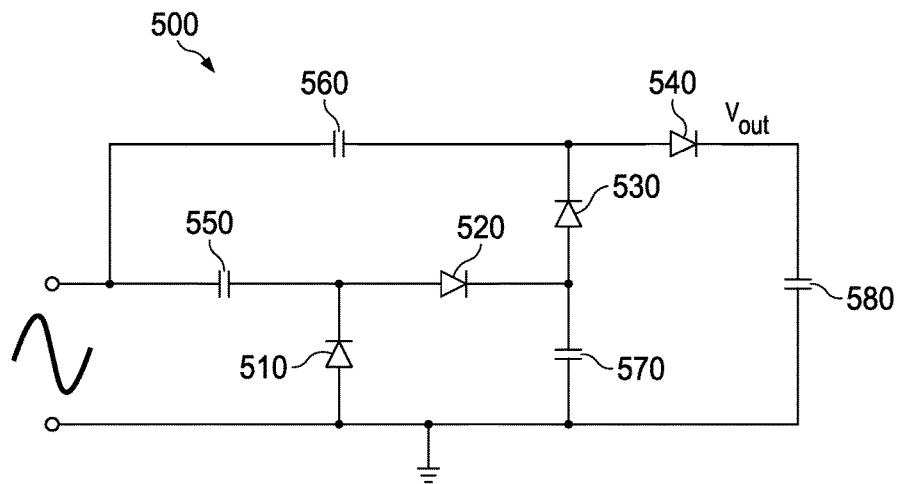
FIG. 5 is a schematic of a Dickson-type charge pump.

FIG. 5 is a schematic of a Dickson-type charge pump. Dickson-type charge pump 500 is operable to both to boost an input signal and to generate an envelope signal (Vout) in response to an input frequency burst. The Dickson-type charge pump 500 includes diodes 510, 520, 530, and 540 as well as capacitors 550, 560, 570, and 580. The Dickson-type charge pump 500 is arranged as a two-stage voltage doubler (e.g., doubling an AC input voltage when assuming that no voltage drop exists across each of the diodes during diode conduction).

In operation (and assuming no voltage drops across the diodes during diode conduction), a negative-going excursion (e.g., during one phase) of the input voltage induces a current through diode 510 which charges the right plate of capacitor 550 and the right plate of capacitor 560 (via diodes 520 and 530). During a subsequent positive-going excursion of the input voltage, the voltages on each of the capacitors 550 and 560 are doubled. The doubled voltage of capacitor 550 induces a current through diode 520 for charging the first stage output capacitor 570, as well as induces a current for diodes 520, 530, and 540 for charging the second stage output capacitor 580. The doubled voltage of capacitor 560 induces a current through diode 540 for charging the second stage output capacitor 580. During subsequent oscillations of the input voltage, the charge on each of the capacitors 570 and 580 is gradually increased (e.g., each cycle) such the signal Vout gradually approaches twice the input voltage.

The Dickson-type charge pump 500 normally only works when the input voltage swing (e.g., the difference between the maximum and minimum input voltages) is more than the diode voltage threshold (Vt). To help avoid this limitation, low (or even "zero") voltage threshold diodes and/or transistors (e.g., gate/source- or drain-coupled) are used. However, many (e.g., low power) integrated circuit manufacturing processes do not have such low voltage threshold devices (e.g., which proscribes use of the Dickson-type charge pump in applications where the voltage input swing is less than the voltage threshold of the diodes used in the Dickson-type charge pump).

Figure 6:
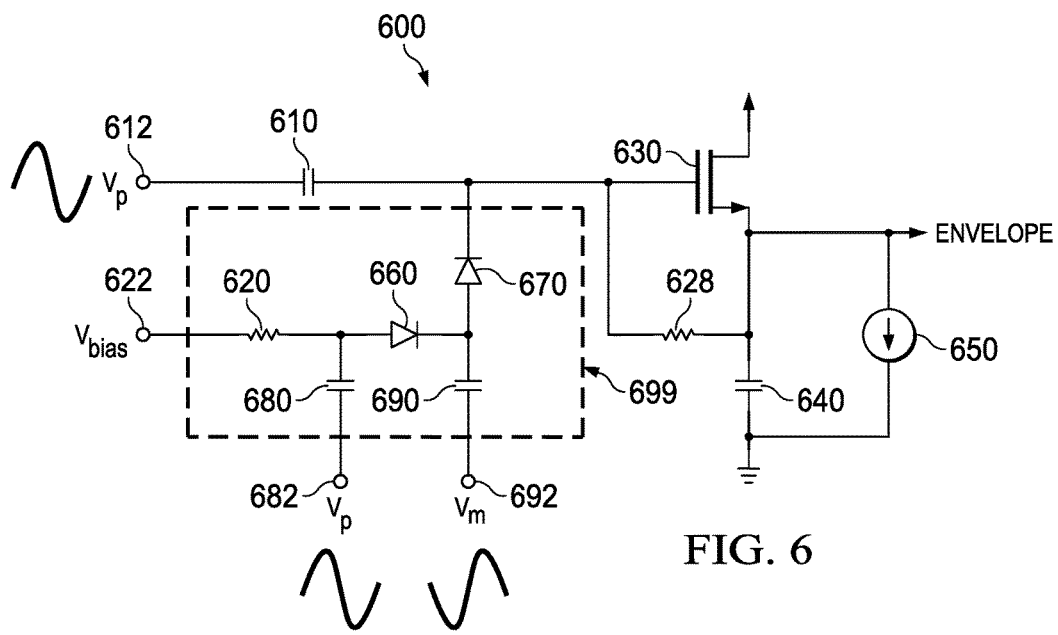
FIG. 6 is a schematic of a low power RF envelope detector in accordance with embodiments of the disclosure.

FIG. 6 is a schematic of a low power RF envelope detector in accordance with embodiments of the disclosure. The envelope detector 600 includes an input capacitor 610, an input signal-responsive bias boost circuit 699, adaptive bias feedback resistor 628, an NMOS transistor 630, an integrator capacitor 640, and a current source 650.

In general, the output of the signal-responsive bias boost circuit 699 is biased to a nominal voltage in absence of an input RF signal, where the nominal voltage is determined in response to the biased currents and biased voltages derived from a particular power supply of the integrated circuit that includes the envelope detector 600. The signal-responsive bias boost circuit 699 (and the differential bias circuit described below with reference to FIG. 8) can be used in any communication channel where a differential input RF signal is present.

When an RF signal is asserted, the output (e.g., output envelope signal) of the signal-responsive bias boost circuit 699 increases from the nominal (e.g., bias) value. The change in the bias voltage can be detected by a comparator (e.g., Schmitt trigger 270). The comparator is operable to convert the DC isolated signal from an analog value to a digital value, which changes the digital state of an output buffer (e.g., delay latch buffer 880) such that the output buffer provides an indication of the presence of an RF input signal.

The RF signal is an input differential signal having a first polarity end (e.g., connection for coupling) and a second polarity end. The RF input signal is typically generated in response to information, where the information is used to gate (e.g., turn on and then turn off) an RF (e.g., carrier) signal. In one example, the RF input signal is generated in response to "ones" and "zeros" of digital information, where the envelope signal indicates the "ones" and "zeros" used to gate the carrier frequency portions of the RF input signal. In another example, the RF input signal is generated by a remote control device (e.g. "remote") in response to information such as proximity or a button press. In such a case, the envelope signal indicates the information such as the proximity of the transmitter and/or the fact that a button was pressed (e.g., which can be used to wake up a battery-powered system from a low power, quiescent mode).

In operation, the input capacitor 610 is operable to couple the input signal Vp (e.g., a non-inverted input signal of an AC-coupled radio frequency isolated signal) at terminal 612 to the gate of transistor 630. The bias boost circuit 699 is operable to generate a bias augmentation charge in response to the signal Vbias at terminal 622 and (at least) the input signals Vp and Vm (e.g., a complementary pair of AC-coupled radio frequency isolated input signals coupled to terminals 692 and 692). The bias augmentation charge (e.g., which is used to generate voltages higher than Vbias) is suitable for controlling the gate of transistor 630. The transistor 630 is operable to generate a current (e.g., for charging capacitor 640) that varies in response to the gate voltage of transistor 630.

The current generated at the source of transistor 630 is coupled to a first terminal of the integrator capacitor 640 (which has a second terminal coupled to ground). Accordingly, a voltage (e.g., the "envelope" signal) is developed at the source of transistor 630. Current source 650 is operable to bias the NMOS transistor 630 such that the current sourced by the transistor 630 produces an envelope signal (illustrated below with respect to FIG. 4) voltage indicating the absence of an input RF signal. The (NMOS) transistor 630 is biased in a subthreshold mode when no RF signal is present such that the transistor 630 only conducts in one direction. When an RF signal is present, the gate voltage is driven high, and extra current is source by transistor 630 such that capacitor 640 is increasingly charged (which raises the voltage on the upper plate of the capacitor 640).

Accordingly, the envelope signal is substantially similar to the gating digital signal when the information used to generate the gating digital signal can be reconstructed from the envelope signal. The feedback resistor 622 (e.g., which can be embodied as a voltage source in various embodiments) is arranged to self-bias the transistor 630.

The diodes 660 and 670 are, for example, diode-coupled transistors. The diodes 660 and 670 are biased in subthreshold region (via resistor 620). In the subthreshold region of the diodes 660 and 670, an input voltage swing (in the input signal Vp and/or Vm) of around a 100 mV difference will normally exhibit diode-like behavior. For example, the diode-like behavior exhibits conduction that is greater in a forward direction than the conduction in a backward direction. Accordingly, the diode does not fully block the reverse direction current but will generally conduct increasingly greater currents in the forward direction until diode system saturates.

The relative values of capacitors 680 and 690 are selected to control the ratio of the $I_{on}$ (forward current through the diode 660) to the $I_{off}$ (little or no reverse current through the diode 660). Typically capacitor 690 is larger than capacitor 680 such that charge cancellation by reverse current through the diode 660 (which occurs when Vp is low) is minimized.

During a negative-going excursion of the input voltage of input signal Vp, the signal Vp asserts a negative voltage on terminals 612 (e.g., coupled to the left plate of capacitor 610) and 682 (e.g., coupled to the bottom plate of capacitor 680), while a positive voltage is asserted on terminal 692 (e.g., coupled to the bottom plate of capacitor 690) by input signal Vm. The positive voltage asserted by input signal Vm is AC-coupled via capacitor 690 (which charges the capacitor 690) to the cathode of diode 660 (which partially blocks the asserted input voltage) and to the anode of diode 670 (which partially charges capacitor 610).

The Vbias signal (a positive voltage developed across resistor 620) is coupled to upper plate of capacitor 680 and to the anode of diode 660. The Vbias signal coupled to the anode of the diode 660 is blocked by the diode 660, which is biased in a subthreshold region. However, the response of capacitor 690 to the positive-going excursion of Vm causes a forward current to be conducted through the diode 670 (as well as a relatively small reverse current through the diode 660) to generate the bias augmentation charge (e.g., by "pumping" charge to the right plate of capacitor 610. As disclosed herein, the positive excursion (e.g., first phase) of the AC component of Vm can be used to charge capacitor 610. Accordingly, the bias augmentation charge is passed by the diode 670 such that a positive charge is applied to the right plate of capacitor 610. The boosted bias voltage is coupled to the right plate of capacitor 610 such that capacitor 610 is charged in accordance the negative voltage asserted on the left plate of capacitor 610 via terminal 692. As described below, the voltage generated by capacitor 610 at the cathode of diode 670 is boosted gradually over several cycles of Vp and Vm to a voltage substantially higher than the AC-portion of the input signal Vp.

During a subsequent positive-going excursion (e.g., second phase) of the input voltage of the signal Vp asserts a positive voltage on terminals 612 and 682, while a negative voltage is asserted on terminal 692 by input signal Vm. Accordingly, the voltage stored/generated across capacitor 610 is additionally boosted by the addition of the voltage of the signal Vp at terminal 612. (The charge on at the right plate of capacitor 610 is not discharged via diode 610 due to the blocking action of the diode.) The negative-going excursion of Vm at terminal 692 removes charge stored in capacitor 690 by the previous positive-going excursion of Vm at terminal 692. However, the positive-going excursion of Vp at terminal 682 causes the capacitor 680 (previously charged via resistor 660) to AC-couple the Vp voltage to the anode of diode 660 where it is summed with Vbias (via resistor 620). The summation of the AC-coupled Vp and Vbias causes diode 660 to forward conduct such that a sufficiently high voltage is applied to the anode of the diode 670 is applied to cause the diode 670 to forward conduct. Accordingly, the forward conduction of diode 670 caused the bias augmentation charge to be passed by the diode 670 such that a positive charge is applied to the right plate of capacitor 610. During subsequent oscillations of the input voltage, the charge on each of the capacitors 610 and 640 is gradually increased (e.g., cycle by cycle) such the signal Vout gradually approaches twice the input voltage. Accordingly, the charge of the capacitor 640 is increase during both phases of each cycle of successive cycles of the input signal.

Figure 7:
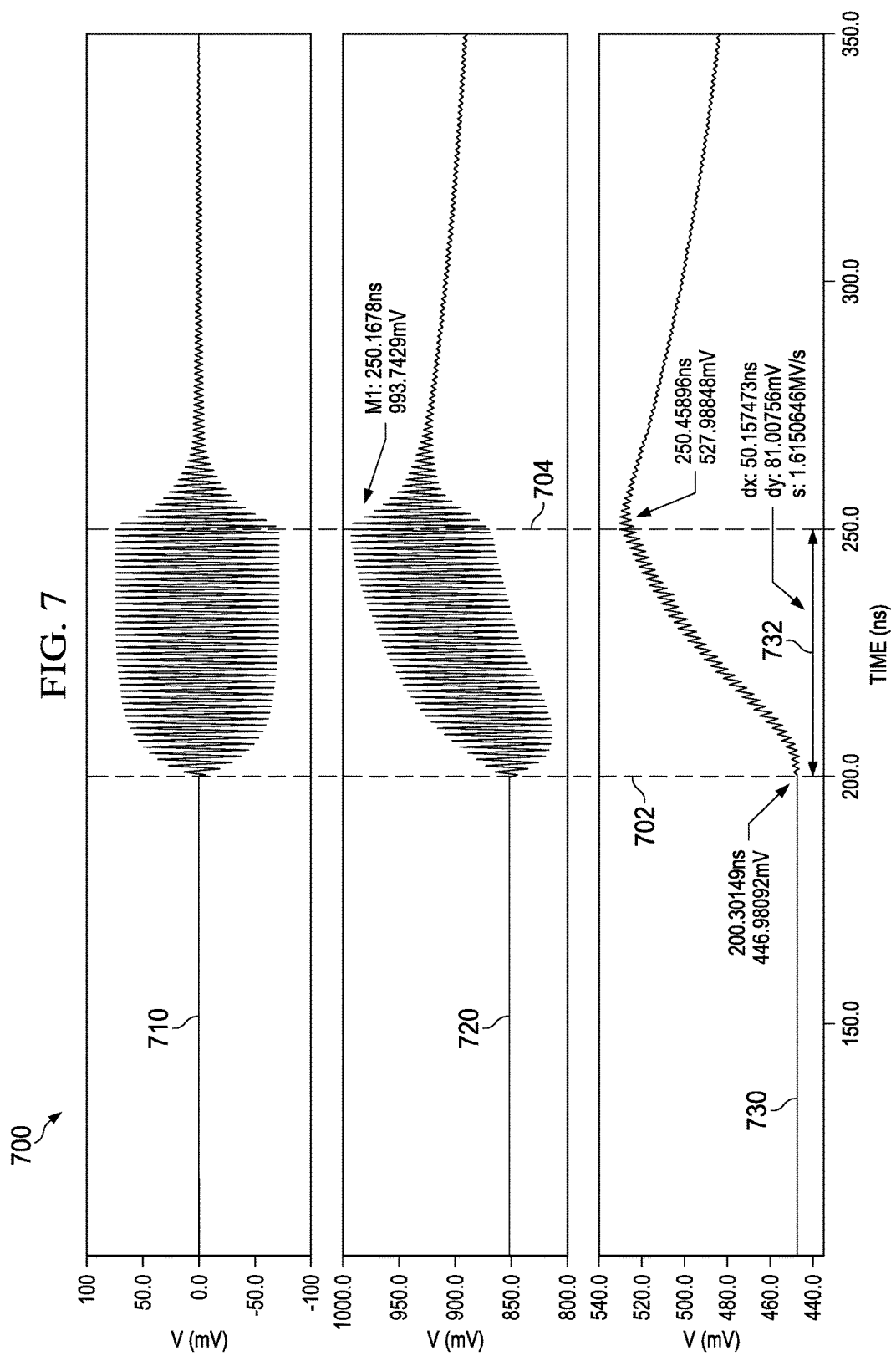
FIG. 7 is a waveform diagram illustrating operation of the envelope detector of FIG. 3 in accordance with embodiments of the disclosure.

FIG. 7 is a waveform diagram illustrating operation of the envelope detector of FIG. 6 in accordance with embodiments of the disclosure. The waveform 710 is the signal Vp discussed above with reference to FIG. 6. The waveform of 710 is characterized by a high frequency burst that is initiated at time 702 and that is released (e.g., gated off) at time 704. In an example simulation, the waveform 710 has a value of 0V before time 702 and has a peak value generally around 70 mV. The waveform 710 has AC components having a magnitude voltage (e.g., peak to peak) of around 80 mV).

The waveform 720 is the voltage present on the anode of the diode 670 (as well as the gate of the transistor 630). As discussed above, the waveform of 720 gradually oscillates around the increasing bias voltage to higher values in accordance with the bias augmentation charge that is supplied during times of forward conduction of the diode 670 that occur after time 702 and before the time 704. (For example, where the bias signal moves upwards in response to an upward movement in maximum values of the waveform 710.) In an example simulation, the waveform 720 has a value of 850 mV before time 702 and has a peak value generally approaching 1V.

The waveform 730 is the envelope signal discussed above with reference to FIG. 6. The waveform 720 starts to trend upward at time 702 in response to the initiation of the high frequency burst reaching a generally maximum value at time 704, at which time the high frequency burst is released. The voltage level of the waveform 720 starts to decay at time 704 in response to the end of the assertion of the burst (which has a duration 732 of around 50 nanoseconds). In the example simulation, the waveform 720 has a value of around 450 mV until time 702, at which time the waveform 720 generally trends upwards and reaches a value generally (e.g., as measured near the midpoint of an oscillation that includes time 704) around 530 mV.

In the example simulation, high voltage threshold transistors are used such that the voltage threshold is around 600 mV (e.g., where threshold voltage is at least around 4 times higher than the input RF signal peak). The envelope detector 600 is operable to detect the envelope of 80 mV peak signal while consuming less than around 2 microamps to generate a differential signal of 100 mV over a period of 50 ns. For example, the voltage thresholds of the transistors from which the diodes are implemented can be at least 4 times the voltage of than the voltage of the (e.g., peak of the positive excursion of the AC components in the) radio frequency input signal and are typically 5 to 6 times the voltage of the AC components. In various embodiments, transistors having any MOSFET threshold can be used.

The reduced power, increase speed, and reduced area of the disclosed envelope detector 1320 are suitable for many RF applications. Such RF applications including OOK (ON-OFF Keying used in radar and wireless data coupling) and low-power RF signal wakeup systems. The RF signal wakeup systems (which are often powered by batteries) include low-power detection circuitry for initial waking up of a system where comparatively lower power consumption, for example, extends the operating time of systems operating from limited power supplies such as portable (including transportable) batteries.

Figure 8:
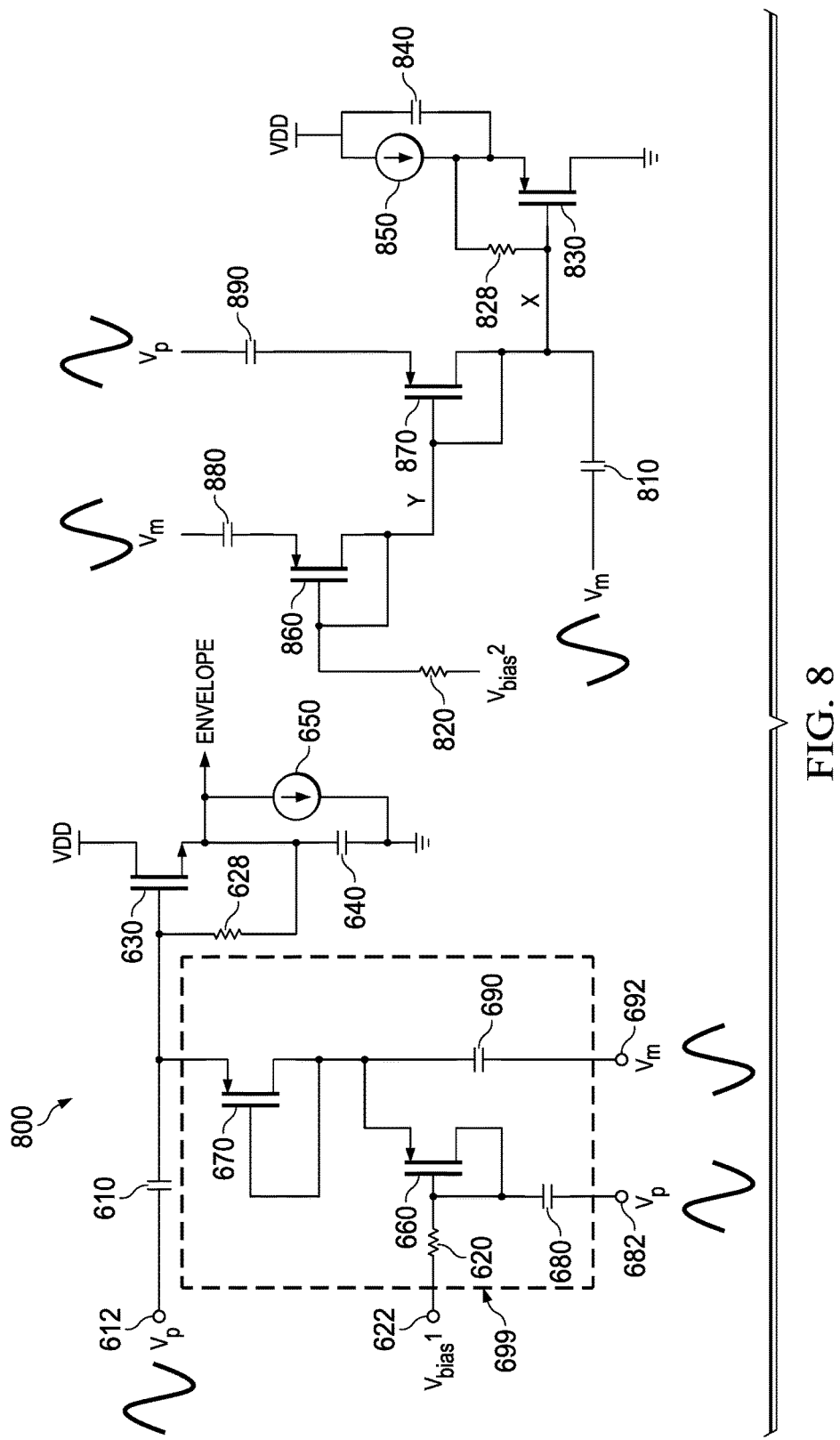
FIG. 8 is a schematic of a differential low power RF envelope detector in accordance with embodiments of the disclosure.

FIG. 8. is a schematic of a differential low power RF envelope detector in accordance with embodiments of the disclosure. The envelope detector 800 includes the envelope detector 800 as well as a similar (but opposite in polarity ends of the RF input signal) envelope detector. For example, the complementary polarity envelope detector includes an input capacitor 810, an input signal-responsive bias boost circuit 899, adaptive bias feedback resistor 828, an NMOS transistor 830, an integrator capacitor 840, and a current source 850.

In general, the complementary polarity envelope detector is similar in structure and function to the envelop detector 600 however MOS types of devices are changed (e.g., so as to draw current from the input capacitors in accordance with the phase of the input signal) as well as the polarities of the input signal are reversed. Likewise, the output signal "Envelope-" is the complement of the output signal "Envelope" such that the output signals when used as differential outputs combine to virtually double the charge used in signaling, to provide enhanced noise immunity, and reduce latency times.

When an RF signal is asserted, the output (e.g., output envelope signal) decreases from the nominal (e.g., bias) value. The change in the bias voltage can be detected by a comparator (e.g., Schmitt trigger 270). The comparator is operable to compare the envelope signal with a reference voltage and convert the DC isolated signal from an analog value to a digital value, which changes the digital state of an output buffer (e.g., delay latch buffer 880) such that the output buffer provides an indication of the presence of an RF input signal.

In operation, the input capacitor 810 is operable to reactively (e.g., capacitively) couple the input signal Vm (e.g., an inverted input signal of an AC-coupled radio frequency isolated signal) to the gate of transistor 830. During the negative half of the cycle (where Vm undergoes a negative excursion), the voltage of the gate of transistor 830 is driven low, which causes transistor 830 to draw more current such that capacitor 840 is progressively discharged. During the negative half of the cycle, the diode/transistor 870 is turned OFF and the diode/transistor 860 is turned ON, which draws some charge from the gate of the diode/transistor 870, which lowers the gate voltage.

During the positive half of the cycle of Vm, the input capacitor 810 is nominally arranged to couple positive voltage at node X. However, the transistor/diode 870 is ON during the positive half of the cycle of Vm because Vp is negative and the source of the transistor/diode 870 is coupled through the capacitor 890. Accordingly the voltage at node X is not be effected by the positive half of Vm input signal via the capacitor 890. Similarly, the transistor/diode 880 is turned OFF during the positive half of the cycle of Vm. Accordingly, the voltage at node X sinusoidally decreases about a decreasing bias signal over multiple cycles of the Vm/Vp input signal.

Accordingly, the envelope signal is substantially similar (but of opposite polarity) to the gating digital signal such that the information used to generate the gating digital signal can be reconstructed from the envelope signal. The feedback resistor 822 (e.g., which can be embodied as a voltage source in various embodiments) is arranged to self-bias the transistor 830.

The diodes 860 and 870 are, for example, diode-coupled transistors (PMOS, similar to the PMOS diodes 660 and 670). The diodes 860 and 870 are biased in subthreshold region (via resistor 820). In the subthreshold region of the diodes 860 and 870, an input voltage swing (in the input signal Vm and/or Vp) of around a 100 mV difference will exhibit diode-like behavior. For example, the diode-like behavior exhibits conduction that is greater in a forward direction than the conduction in a backward direction. Accordingly, the diode does not fully block the reverse direction current but will generally conduct increasingly greater currents in the forward direction until the diode system saturates.

The relative values of capacitors 880 and 890 are selected to control the ratio of the $I_{on}$ (forward current through the diode 860) to the $I_{off}$ (little or no reverse current through the diode 860). Typically capacitor 890 is larger than capacitor 880 such that charge cancellation by reverse current through the diode 860 (which occurs when Vm is low) is minimized.

Figure 9:
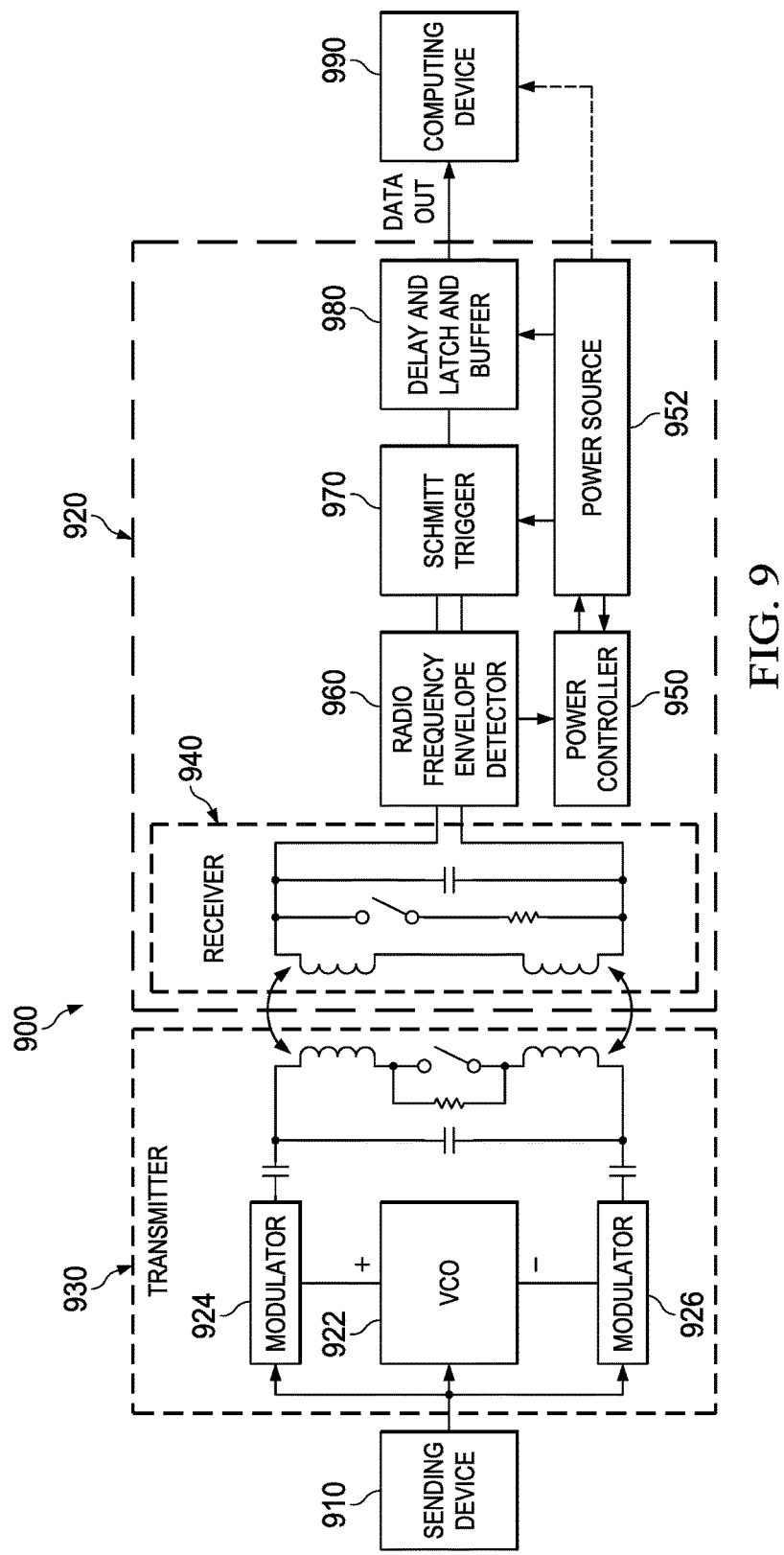
FIG. 9 is a block diagram of an example inductively coupled digital isolator system in accordance with embodiments of the present disclosure.

FIG. 9 is a block diagram of an example inductively coupled digital isolator system 900 in accordance with embodiments of the present disclosure. The digital isolator system 900 includes a sending device 910, an inductively coupled digital isolator 920, and a computing device 990. In operation, the computing device 910 is arranged to transmit digital information to be received by the computing device 990. The sending device can be a remote control for waking up the computing device 990, for example.

The inductively coupled digital isolator 920 is arranged to receive the transmitted digital information. The transmitted the digital information is coupled to the voltage controlled oscillator (VCO) 922, the high side modulator 924, and the low side modulator 926. The voltage controlled oscillator 922 is arranged to generate a high frequency carrier signal to be modulated by the high-high-side modulator 924 and the low-side modulator 926. The high-side modulator 924 and the low-side modulator 926 are arranged in a push/pull configuration and are operable to generate burst transmissions, which are gated in accordance with the digital information received from the computing device 910.

The burst transmissions are coupled to the transmitter 930 of the inductively coupled digital isolator 920. The transmitter 930 is operable to generate an electromagnetic field for crossing an isolation boundary and inducing a voltage in the receiver 940. The power of the isolated signal in the receiver 940 is substantially attenuated below the power level of the signal used to generate the electromagnetic field of the transmitted signal. As discussed above, the disclosed envelope detector is capable of boosting voltages received from the input signal, which can eliminate the need for an amplifier (which dissipates a substantial amount of power, for example, when the device is in a lower power mode, such as a quiescent state).

The radio frequency envelope detector 960 is operable to convert the alternating current (AC) amplifier, isolated signal to a direct current (DC) isolated signal. The Schmitt trigger 970 is operable to convert the DC isolated signal from an analog value to a digital value. The delay latch buffer 980 is operable to "deglitch" (e.g., filter out erroneous transitions in) the digital signal where transitions in the signal exceed a bit rate expected for the digital information received from the computing device 910. The delay latch buffer 980 is operable to transmit the filtered digital isolated signal as signal "data out" such that the computing device 990 is coupled to the digital information transmitted by the computing device 910. The signal "data out" is operable to provide an indication of information used to gate (e.g., modulate, turn on or off, shape, and the like) radio frequency portions of the input signal.

In an example application, the radio frequency envelope detector 960 detects the presence of an RF input signal and awakens the computing device 990 (via the data output signal) from a quiescent (e.g., power) mode to an active mode. When an RF input signal is received by the radio frequency envelope detector 960, the radio frequency envelope detector 960 uses charge from in the input signal to boost the envelope signal (which saves power, for example, during a quiescent power mode). The power controller 950 detects a change in state in the envelope signal and, in response, signals the power source 952 to apply power to the computing device 990 such that the computing device 990 is awakened in response to the assertion (and/or presence) of the radio frequency input signal.

Figure 10:
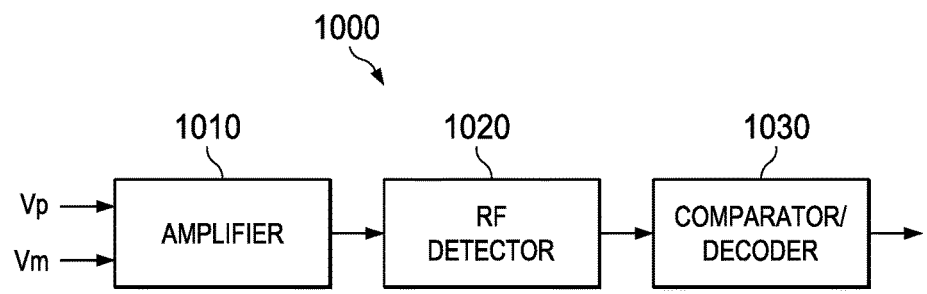
FIG. 10 is a top-level block diagram of an example RF detector system in accordance with embodiments of the present disclosure.

FIG. 10 is a top-level block diagram of an example RF detector system 1000 in accordance with embodiments of the present disclosure. The RF detector system 1000 includes an amplifier 1010, an RF detector 1020, and a comparator/decoder 1030. In operation, the amplifier 1010 is arranged to amplify an RF signal received from any generic RF source. For example, the amplifier 1010 is coupled to signals Vp and Vm, which are differential signals (e.g., different polarity ends) of an RF signal.

The RF detector 1000 is an RF detector such as envelope detector 600 and/or envelope detector 800. Accordingly the RF detector 1000 is operable to receive an RF signal (such as the amplified RF signal amplified by the amplifier 1010) and to generate a signal indicating the presence (and/or timing) of the RF signal. As described above (e.g., with respect to FIG. 6 and FIG. 8), the RF detector 1000 is operable to pump charge from the received RF signal into (or from) a bias signal, wherein the bias signal is used to generate the signal for indicating the presence (and/or timing) of the RF signal.

The comparator/decoder 1030 is coupled to receive the signal for indicating the presence (and/or timing) of the RF signal and is operable to perform a comparison of the signal for indicating the presence (and/or timing) of the RF signal against a reference signal. When the signal for indicating the presence (and/or timing) of the RF signal exceeds the threshold of the reference signal, the comparator/decoder is operable to generate a digital signal for indicating the presence (and/or timing) of the RF signal. For example, the digital signal for indicating the presence (and/or timing) of the RF signal can be used to wake up a quiescent system, extract digital information used to encode the RF signal, and perform other such applications where information is extracted from the RF signal.

The reduced power, increased speed, and reduced area of the disclosed RF detector 1000 are suitable for many RF applications, including OOK (used in radar and wireless data coupling) and low-power RF signal detection circuitry for initial waking up of a system (where comparatively lower power consumption, for example, extends the operating time of systems operating from limited power supplies, such as batteries).

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A circuit, comprising:
a charging transistor for controlling the charge supplied to an output capacitor wherein the charge supplied to the output capacitor generates an output envelope signal;
a first input capacitor for coupling an input signal to a gate of the charging transistor;
a second input capacitor for coupling a first polarity end of the input signal to a first diode, wherein the first diode is operable to couple charge to the first input capacitor and to the gate of the charging transistor in response to a positive excursion of the first polarity end of the input signal; and
a third input capacitor for coupling a second polarity end of the input signal to a second diode coupled in series with the first diode, wherein the first and second diode are operable to couple charge to the first input capacitor and to the gate of the charging transistor in response to a positive excursion of the second polarity end of the input signal.

2. The circuit of claim 1, wherein the first input capacitor couples the first polarity end of the input signal to the gate of the charging transistor.

3. The circuit of claim 2, wherein the second polarity end of the input signal is coupled to a first terminal of the first input capacitor and wherein a second terminal of the first input capacitor is coupled to a cathode of the first diode.

4. The circuit of claim 3, wherein the first polarity end of the input signal is coupled to an anode of the first diode, wherein the first diode forward conducts in response to a positive excursion of the first polarity end of the input signal, and wherein the second diode substantially blocks charge supplied by the positive excursion of the first polarity from discharging the third capacitor.

5. The circuit of claim 4, wherein the second diode forward conducts in response to a positive excursion of the second polarity end of the input signal, and wherein the first diode forward conducts in response to the forward conduction of the second diode.

6. The circuit of claim 4, wherein the second capacitor has a larger capacitance than the third capacitor.

7. The circuit of claim 1, wherein the input signal is a radio frequency signal gated in response to information to be transmitted.

8. The circuit of claim 7, wherein the output envelope signal provides an indication of the information to be transmitted.

9. The circuit of claim 1, wherein the indication of the information to be transmitted wakes up the circuit from a quiescent mode.

10. The circuit of claim 1, wherein the output envelope signal of the input signal is developed in response to the charge stored by the output capacitor.

11. The circuit of claim 1, wherein the first and second diodes have voltage thresholds that are greater than twice the magnitude of the peak voltage of AC components of the input signal.

12. The circuit of claim 1, wherein charge from the input signal is coupled to the output storage capacitor during a positive excursion of the first polarity end of the input signal, and wherein charge from the input signal is coupled to the output storage capacitor during a positive excursion of the first polarity end of the input signal.

13. A system, comprising:
a charging transistor for controlling the charge of an output capacitor wherein the charge of the output capacitor develops an output envelope signal;
a first input capacitor for coupling an input signal to a gate of the charging transistor, wherein the input signal is a differential signal having a first polarity end and a second polarity end;
a second input capacitor for coupling the second polarity end of the input signal to a first diode, wherein the first diode is operable to couple charge to the first input capacitor and to the gate of the charging transistor in response to a first phase of the second polarity end of the input signal; and
a third input capacitor for coupling the first polarity end of the input signal to a second diode coupled in series with the first diode, wherein the first and second diodes are operable to couple charge to the first input capacitor and to the gate of the charging transistor in response to a second phase of the first polarity end of the input signal;
a comparator for comparing the envelope signal with a reference voltage and for providing an indication of the comparison; and
a output buffer for generating, in response to the indication of the comparison, a data output signal for providing an indication of the information used to gate carrier frequency portions of the input signal.

14. The system of claim 13, comprising a portable power storage device for providing power to the comparator and to a computing device.

15. The system of claim 14, comprising the computing device, wherein the computing device is operable to be wakened from a quiescent mode to the active mode in response to the data output signal.

16. The system of claim 15, wherein an amount of the charge stored by the first capacitor is increased during both phases of each cycle of the input signal.

17. The system of claim 13, wherein the first and second diodes have voltage thresholds that are at least three times the magnitude of the voltage of AC components of the input signal.

18. The system of claim 13, comprising an output buffer for gating a radio frequency signal in response to information for transmitting the input signal, and comprising a receiver for receiving the gated radio frequency signal as the input signal.

19. A method, comprising:
controlling the charge supplied to an output capacitor by biasing a gate of a charging transistor;
developing an output envelope signal in response to the charge stored on the output capacitor, wherein the envelope signal provides an indication of information for generating an input signal;
reactively coupling the input signal across a first capacitor to the gate of the charging transistor;
reactively coupling a first polarity end of the input signal to a first diode, wherein the first diode is operable to couple charge to the first input capacitor and to the gate of the charging transistor in response to a positive excursion of the first polarity end of the input signal; and
reactively coupling the second polarity end of the input signal to a second diode coupled in series with the first diode, wherein the first and second diodes are operable to couple charge to the first input capacitor and to the gate of the charging transistor in response to a positive excursion of the second polarity end of the input signal.

20. The method of claim 19, wherein the first polarity end of the input signal is coupled to a first terminal of the first input capacitor that is different from a second terminal of the first input capacitor to which a cathode of the first diode is coupled.

* * * * *